United States Patent
Bjarnason et al.

(10) Patent No.: US 6,905,628 B2
(45) Date of Patent: Jun. 14, 2005

(54) METHOD IN ETCHING OF A SUBSTRATE

(75) Inventors: Bjarni Bjarnason, Södra Sandby (SE);
Per Petersson, Lund (SE)

(73) Assignee: Obducat Aktiebolag, Malmo (SE)

( * ) Notice: Subject to any disclaimer, the term of this patent is extended or adjusted under 35 U.S.C. 154(b) by 618 days.

(21) Appl. No.: 09/956,082

(22) Filed: Sep. 20, 2001

(65) Prior Publication Data

US 2002/0042198 A1 Apr. 11, 2002

Related U.S. Application Data

(60) Provisional application No. 60/234,184, filed on Sep. 20, 2000.

(30) Foreign Application Priority Data

Sep. 20, 2000 (SE) .............................. 0003345

(51) Int. Cl.[7] .................................................. C23F 1/00
(52) U.S. Cl. ............................ 216/100; 216/41; 216/83
(58) Field of Search ............................ 216/41, 83, 100

(56) References Cited

U.S. PATENT DOCUMENTS

| | | |
|---|---|---|
| 4,877,480 A | 10/1989 | Das .............................. 156/635 |
| 5,176,792 A | 1/1993 | Fullowan et al. |
| 5,279,702 A | 1/1994 | Douglas |
| 5,837,616 A | 11/1998 | Yamanaka |
| 5,858,257 A * | 1/1999 | Naitoh ......................... 216/92 |
| 5,962,346 A | 10/1999 | Shue et al. |

FOREIGN PATENT DOCUMENTS

| | | |
|---|---|---|
| JP | 3-82120 | 4/1991 |
| SE | 513 829 | 11/2000 |
| WO | WO 99/45179 | 9/1999 |

* cited by examiner

Primary Examiner—Shamim Ahmed
(74) Attorney, Agent, or Firm—Finnegan, Henderson, Farabow, Garrett & Dunner, L.L.P.

(57) ABSTRACT

In etching, an etchant (4) for etching of a substrate (1) is applied in a given pattern. Before etching, a resist layer (2) is applied to the substrate (1) in said pattern to define at least one exposed portion (3) of the substrate (1). In order to minimize under etching, a passivating substance is arranged, before etching, on the substrate (1) to also define said pattern, i.e., at the periphery of the exposed portion (3). The passivating substance is such as to form, during etching, an etch-protecting compound at the periphery.

11 Claims, 1 Drawing Sheet

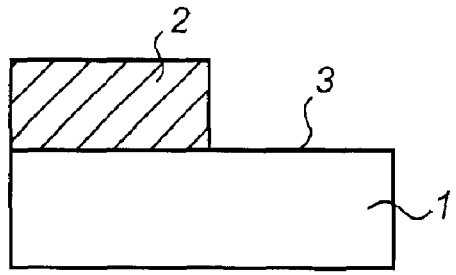
Fig. 1          Fig. 2
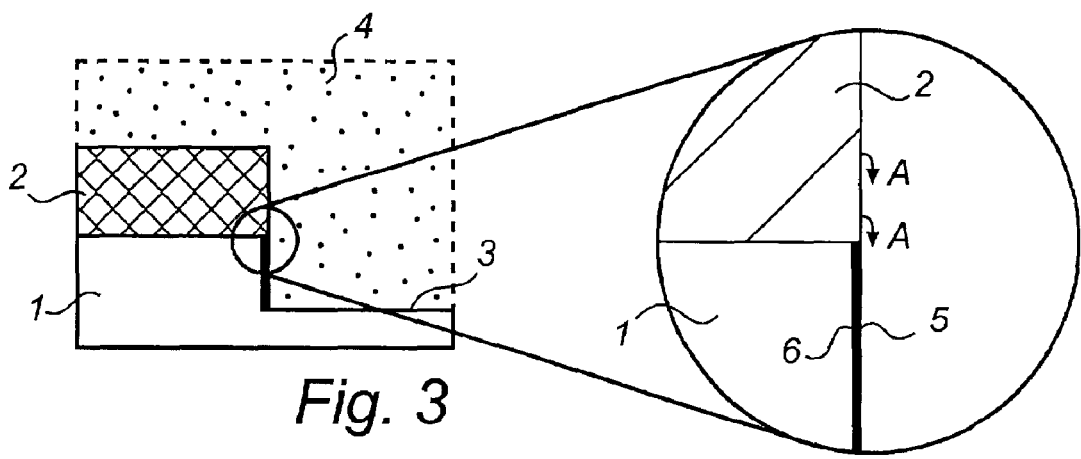
Fig. 3
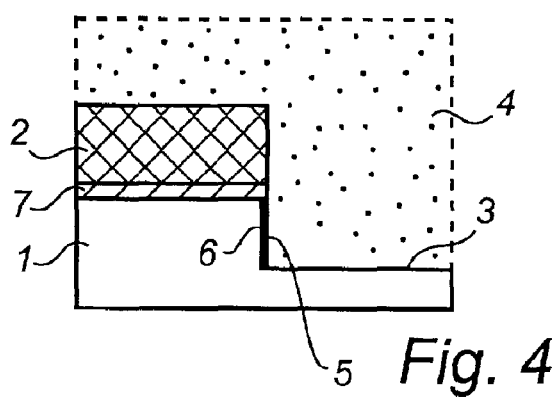
Fig. 4

METHOD IN ETCHING OF A SUBSTRATE

This application claims the benefit of U.S. Provisional Application No. 60/234,184 filed Sep. 20, 2000, the content of which is incorporated herein by reference, and claims the right to priority based on Swedish Application No. 0003345-6, filed Sep. 20, 2000.

FIELD OF THE INVENTION

The invention relates generally to etching of a substrate to produce small structures in the same. More specifically, the invention relates to a method of providing anisotropy in material-dissolving etching.

BACKGROUND ART

Micro- and nanostructures can be produced in a substrate by etching away selected parts of the surface of the substrate. These parts of the surface of the substrate are contacted with an etchant which is capable of reacting in an etching manner with the substrate material. As a rule, the substrate is before etching coated with a layer of etch-protecting material (resist) which reacts slowly, if at all, with the etchant. The etch-protecting layer is often produced in a multistage process comprising a coating step, in which the etch-protecting material is applied over the entire substrate surface, and an exposing step, in which a pattern of exposed portions is produced in the etch-protecting material applied to the substrate. The exposing step can be accomplished by the applied etch-protecting material (photo resist) being radiated through a mask and subsequently developed for exposing of either the radiated or unradiated portions thereof.

During the etching procedure, dissolution and/or mechanical removal of the substrate material is accomplished in the exposed portions. The material-dissolving etching methods can be divided into wet and dry techniques. In wet material-dissolving etching methods a liquid etchant is used. In chemical wet etching the etchant reacts spontaneously with the substrate material, and in electrochemical wet etching the etchant reacts by electrochemical reactions at the surface of the substrate material when the etchant, with applied voltage, carries a current.

In wet etching methods, and also in some dry etching methods, such as plasma etching, the material-dissolving surface reactions which are intended to occur merely on the exposed portions of the substrate, also have a certain tendency to occur in the periphery of the exposed portions, and also under the etch-protecting layer, and thus give rise to so-called underetching. Such underetching restricts the possibilities of producing narrow and deep structures, e.g. to arrange conductors close to each other. Although an increased duration of the etching procedure results in an increased depth of the etched structures, it also results at the same time in an increased tendency to underetching.

Even if dry etching methods are preferred in this respect as they produce a result with less under-cut, they are not as fast as wet etching methods.

Examples on dry etching are given in U.S. Pat. Nos. 5,962,346, 5,176,792, 5,837,616 and JP 3 082 120. Thus, when the etching is to be performed at a high rate, wet etching methods are preferred due to their higher capability to etch at high rates. This is primarily due to the fact that transportation of etchant towards the substrate as well as transportation of material away from the substrate is faster in a fluid than in a plasma during wet etching.

U.S. Pat. No. 4,877,480 discloses a method for etching a substrate by removing material by means of laser. For cooling of the substrate during radiation, the substrate is immersed in a liquid which is capable of etching and which is activated by radiation. During the etching procedure, the removing etching effect of the laser light is thus assisted by the material-dissolving etching effect of the liquid. It is said that etching of smaller structures than normal is made possible.

U.S. Pat. No. 5,279,702 discloses a technique for chemical wet etching of a substrate. The substrate which is coated with a patterned resist layer, is immersed in a spontaneously etching etchant. This etchant contains a passivating substance which spontaneously forms an etch-protecting compound on the exposed portions of the substrate, whereby these portions become unreactive to the etchant. By radiation of the substrate perpendicular to its surface, the etch-protecting compound is removed in the direction of the radiation so that etching can proceed in exposed portions of the substrate. However, the etch-protecting compound prevents continued etching at the periphery of the exposed portions, which is protected from radiation by the superposed etch-protecting layer. During the etching procedure, a barrier thus forms on the side walls of the etching structure, thereby minimizing underetching.

A limitation of the above techniques is that the substrate must be radiated during the entire etching procedure to enable etching. Such radiation can in many cases be difficult to provide.

SUMMARY OF THE INVENTION

In view hereof, an object of the invention is to provide an improved method in wet etching, which obviates the above drawbacks of prior-art technique.

This and other objects that will be evident from the following description are now achieved by a method in wet etching of a substrate, in which an etchant is applied for etching the substrate in a given pattern, characterized in that a passivating substance is arranged on the substrate to define said pattern, and that the passivating substance during etching is made to form an etch-protecting compound which defines said pattern on the substrate, wherein the passivating substance comprises an active substance which reacts with a component, which during etching is contained in the etchant, to form the etch-protecting compound, wherein the etchant is a solution and wherein the active substance comprises ions which are soluble in the etchant and which form a compound, which is at least difficult to dissolve in the solution, with said component.

The inventive method is based on the understanding that a passivating substance, which during etching forms an etch-protecting compound, is to be arranged in the immediate vicinity of, but not on top of, the portions that are to be etched away. The passivating substance is thus arranged on the substrate to define the pattern which is to be etched in the same. During the etching of a structure in the surface of the substrate, the passivating substance is made to form an etch-protecting compound which defines said pattern on the substrate, whereby thus a barrier of the etch-protecting compound automatically is formed on the side walls of the structure and prevents underetching. A significant simplification is achieved in etching compared to prior art, in that the protection against underetching is automatically located where it is needed, viz. in direct connection with the portions that are to be etched away, without necessitating radiation or equivalent measures. As a result, etching of small structures with a minimum of underetching is easily rendered possible.

The method according to the invention is applicable in both chemical and electrochemical wet etching, and combinations thereof.

According to the invention, the active substance of the passivating substance reacts with a component which during etching is positioned at the surface of the substrate, to form the etch-protecting compound. This component can be contained in the etchant or be formed in the etching of the substrate, for instance by release of ions from the substrate. In both cases, it is guaranteed that the etch-protecting compound formed defines the pattern which is to be etched on the substrate.

An etch-protecting layer is usually applied to the substrate before etching. It is preferred for the etch-protecting layer to be applied to the substrate in said pattern to define at least one exposed portion of the substrate, and for the passivating substance to be arranged at the periphery of the exposed portion so that the etch-protecting compound exclusively forms at this periphery. This is provided, according to a preferred embodiment, by the passivating substance being incorporated into the etch-protecting material which is later applied to the substrate to form the etch-protecting layer. This means that the passivating substance is automatically located in the periphery of the exposed portion of the substrate in connection with the forming of the pattern in the etch-protecting layer. During the etching procedure, the passivating substance, or an active substance thereof, leaks out of the etch-protecting layer and forms the etch-protecting compound at the periphery of the exposed portion of the substrate.

Preferably, the etch-protecting layer is essentially an organic material.

According to another preferred embodiment, at least one release layer containing the passivating substance is applied to the substrate before the etch-protecting layer forms thereon. The release layer can thus be given a composition and a thickness which cause a desired local concentration of the passivating substance, or an active substance thereof, at the periphery of the exposed portion.

Preferably, the release layer essentially consists of an organic material. This is advantageous in that the adhesion of the etch protecting layer to an organic layer is good.

The etch protecting compound is thus according to the present invention produced by an ion reaction. A major advantage with the method according to the present invention is that the choice of ions may be varied within a wide range due to the fact that the component, which is to react with the active substance of the passivating substance, not has to be an etchant but may be freely chosen so as to achieve a good etch protecting layer.

Thus, the passivating substance is preferably contained in an organic material, either in an etch-protective layer or in a release layer.

BRIEF DESCRIPTION OF THE DRAWING

The invention and its advantages will be described in more detail below with reference to the accompanying schematic drawing which by way of example illustrates the presently preferred embodiments.

FIGS. 1–3 are part-sectional views of a substrate to illustrate a method in etching according to a first embodiment of the invention, and FIG. 4 is a part-sectional view of a substrate to illustrate a method in etching according to a second embodiment of the invention.

DESCRIPTION OF THE EMBODIMENTS OF THE INVENTION

A first embodiment of the invention will now be described with reference to FIGS. 1–3.

FIG. 1 shows a part of a substrate 1 which is to be etched. In a first step, an etch-protecting material, e.g. a photoresist, is applied to the surface of the substrate to form an etch-protecting layer 2. The etch-protecting layer 2 serves to protect the underlying substrate 1 against etching. In a subsequent exposing step, selected portions of the etch-protecting layer 2 are removed in a manner known per se, so that the substrate 1 is exposed in a given pattern, as is evident from FIG. 2. The thus-exposed portions 3 of the substrate 1 are then allowed to react with an etchant 4 in a subsequent etching step, as shown in FIG. 3.

In the etching step according to FIG. 3, the etchant 4 is applied in the form of an electrolyte, which is forced electrochemically and/or chemically to etch the substrate 1. In electrochemical etching, the electrolyte 4 usually comprises a neutral salt which is not capable of reacting in an etching manner with the substrate 1, or an acid or a base. The electrolyte 4 can also contain a chemically oxidating component which in itself is capable of reacting in an etching manner with the substrate 1. In chemical etching, the electrolyte 4 contains a relatively high content of such a chemically oxidating component.

In the shown embodiment, a passivating substance (not shown) is contained in the etch-protecting layer 2. This passivating substance forms during the etching step an etch-protecting compound on the substrate 1. During the etching step, the passivating substance or an active substance thereof leaves the etch-protecting layer 2, as indicated by arrows A in FIG. 3, in order to form, with a component positioned adjacent to the substrate 1, an etch-protecting compound which is difficult to dissolve or unsoluble. This compound settles on the periphery of the exposed portion 3 and forms a local barrier 5 against continued etching. The barrier 5 comprises at least a monolayer of the etch-protecting compound in physical contact with the substrate 1. During the etching step, a gradual and spontaneous composition of the barrier 5 occurs on the side walls 6 of the structure forming in the substrate. The composition of the barrier 5 occurs essentially in a self-regulating process. If the etchant 4 tends to dissolve the substrate 1 also under the etch-protecting layer 2, the exposed surface of the etch-protecting layer 2 to the etchant 4 will increase, and the passivating substance, or its active substance, will to an increased extent leave the etch-protecting layer 2 and react with the above-mentioned component. Consequently also the forming of the etch-protecting compound increases.

The degree of barrier effect at the periphery of the exposed portion 3 of the substrate 1 can be controlled by, for example, changing the amount of the passivating substance contained in the etch-protecting material, or the thickness of the etch-protecting layer 2. It may also be advantageous to restrict the amount of the passivating substance contained in the etch-protecting material, so that the exposing step can be carried out by conventional methods, such as exposure and development.

In the shown example, the substrate 1 is made of metal, typically Cu, Cr, Ag, Au, Ni, or an alloy. In the shown example, use is also made of an etch-protecting layer 2 which is formed of an organic etch-protecting material, such as a liquid photoresist. This passivating substance is in this case typically an ion compound which contains inorganic anions, such as $I^-$, $F^-$, $Cl^-$, $Br^-$, $S^{2-}$, $SCN^-$, $CN^-$, $SO_4^{2-}$, $C_2O_4^{2-}$, $PO_4^{3-}$, $CO_3^{2-}$ or $CrO_4^{2-}$, and which can be admixed with the organic etch-protecting material. Examples of such passivating substances are ion pairing reagents, such as tetrabutyl ammonium iodide. According to one more alternative, the passivating substance is a compound, such as thioacetamide, which in another manner can be converted to a suitable anion. The passivating substance is suitably selected so that it, or its active substance, e.g. its anion, in reaction with a component positioned adjacent to the substrate 1, forms the compound which is difficult to dissolve and which settles on the substrate 1. This component can be cations which are released from the metallic substrate 1 during etching, or a cation which is included, naturally or as an additive, in the etchant 4. The latter case allows use of a given passivating substance when etching different types of substrate material, since the passivating substance need not cooperate with the substrate material to form the etch-protecting compound.

As an example, mention can be made of etching of a substrate 1 of copper, or a copper alloy. According to a conceivable alternative, use is made of a passivating substance containing iodide as an active substance, e.g. tetrabutyl ammonium iodide. During the etching step, iodide ions leave the etch-protecting layer 2 and react with copper ions, which are released from the substrate 1 during etching, to form copper iodide (CuI) which protects the side walls 6 of the etching structure against continued etching. According to one more conceivable alternative, use is made of chloride ions as an active substance, which after leaving the etch-protecting layer 2 react with silver ions in the etchant 4 and form etch-protecting silver chloride (AgCl) which settles on the periphery of the exposed portions 3 of the substrate 1.

The above is only intended to be a non-limiting example to illustrate the invention. It will be appreciated that for each given substrate material there are many different combinations of passivating substance and component which can be caused to form a suitable etch-protecting compound. According to one alternative, a cation, instead of an anion, from the passivating substance can act as an active substance and form the compound which is difficult to dissolve, by reaction with the component positioned adjacent to the substrate. Other compounds than ion compounds can also be used if they are soluble in the etch-protecting material, e.g. organic compounds capable of complexing, directly or via an active substance, the component at the substrate, for instance an anion or a cation.

FIG. 4 shows an alternative embodiment of the invention. In this embodiment, first one or more release layers 7 containing the passivating substance are applied to the substrate 1. The release layer 7 is preferably thin and applied directly to the substrate 1. A thickness of about 50–1000 nm has been found to give satisfactory results. However, also other thicknesses may be used. Subsequently, an etch-protecting material, preferably free from the passivating substance, is applied in an etch-protecting layer 2 on the release layer 7, whereupon selected portions of the etch-protecting layer 2 and the release layer 7 are removed in an exposing step, in a manner known per se, so that the substrate 1 is exposed in a given pattern, as is evident from FIG. 4.

Like in the first embodiment according to FIGS. 1–3, the passivating substance, or an active substance thereof, will locally leave the release layer 7 and form the etch-protecting barrier 5 at the periphery of the exposed portion 3 of the substrate 1. Since the release layer 7 can be arranged with an optional thickness and an optional amount of the passivating substance, the release of the passivating substance, or its active substance, at the periphery of the exposed portion 3 can be guided to optimized values. This embodiment allows, in addition to the advantages of the method according to the first embodiment, a further optimization of the protection against underetching. Moreover this embodiment allows greater freedom in the choice of the passivating substance since this need not be soluble in the etch-protecting layer 2.

Depending on the choice of the passivating substance, and its concentration in the release layer 7, an extra exposing step, such as plasma etching, may possibly be necessary before the etching step in order to completely expose the substrate 1 according to a defined pattern.

It will be appreciated that the invention is not limited to the above detailed description of presently preferred embodiments, and can be modified within the scope of the appended claims.

The active component of the passivating substance may alternatively be a cation. In this case the component is suitably an anion.

What is claimed is:

1. A method for wet etching a substrate comprising arranging a passivating substance in a pattern on a substrate and applying a solution of an etchant to the substrate to etch the substrate in said pattern, wherein the passivating substance contains an active substance that reacts with a component present in the etchant during etching to form an etch-protecting compound which defines said pattern on said substrate, said active substance being ions that are soluble in the etchant solution and said etch-protecting compound, formed from said ions and said component, being at least difficult to dissolve in the etchant solution.

2. The method of claim 1, wherein an etch-protecting layer is applied to the substrate in said pattern to define at least one exposed portion of the substrate before etching, and wherein the passivating substance is arranged at a periphery of the exposed portion, so that the etch-protecting compound formed during etching forms exclusively at said periphery.

3. The method of claim 2, wherein at least one release layer containing the passivating substance is applied to the substrate, and wherein the etch-protecting layer is applied to said at least one release layer.

4. The method of claim 3, wherein the at least one release layer is applied directly to the surface to be etched.

5. The method of claim 3, wherein the release layer essentially comprises organic material.

6. The method of claim 3, wherein said pattern is formed in the etch-protective layer and in said at least one release layer before application of the etchant solution.

7. The method of claim 2, wherein the passivating substance is incorporated into an etch-protecting material that is applied to the substrate to form said etch-protecting layer.

8. The method of claim 7, wherein said pattern is formed in the etch-protecting layer before the application of the etchant solution.

9. The method of claim 2, wherein the etch-protecting layer essentially comprises organic material.

10. The method as claimed in any one of claims 1–9, wherein said component is formed during the etching of the substrate.

11. The method claim 10, wherein the component is formed by the release of ions from the substrate.

* * * * *